United States Patent
Jobetto

(10) Patent No.: US 6,888,209 B2
(45) Date of Patent: May 3, 2005

(54) SEMICONDUCTOR PACKAGE AND METHOD OF FABRICATING THE SAME

(75) Inventor: Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 10/663,043

(22) Filed: Sep. 15, 2003

(65) Prior Publication Data

US 2004/0056340 A1 Mar. 25, 2004

(30) Foreign Application Priority Data

Sep. 20, 2002 (JP) .................................. 2002-274807

(51) Int. Cl.[7] .............................................. H01L 23/02
(52) U.S. Cl. ........................ 257/459; 257/99; 257/687
(58) Field of Search .................... 257/459, 99, 687, 257/462, 678

(56) References Cited

U.S. PATENT DOCUMENTS

| | | | |
|---|---|---|---|
| 5,962,810 A | | 10/1999 | Glenn |
| 6,348,728 B1 | * | 2/2002 | Aiba et al. .................. 257/678 |
| 6,600,234 B2 | * | 7/2003 | Kuwabara et al. .......... 257/790 |
| 6,673,698 B1 | * | 1/2004 | Lin et al. .................... 438/459 |
| 6,740,964 B2 | * | 5/2004 | Sasaki ......................... 257/687 |
| 6,746,898 B2 | * | 6/2004 | Lin et al. .................... 438/113 |
| 2002/0093078 A1 | * | 7/2002 | Paek ........................... 257/676 |
| 2002/0132461 A1 | * | 9/2002 | Kizaki ......................... 438/612 |
| 2002/0149086 A1 | * | 10/2002 | Aoki ........................... 257/528 |
| 2003/0038331 A1 | * | 2/2003 | Aoki et al. ................. 257/459 |
| 2003/0230804 A1 | * | 12/2003 | Kouno et al. ............... 257/734 |

FOREIGN PATENT DOCUMENTS

| | | | |
|---|---|---|---|
| JP | 1-220477 | * | 9/1989 |
| JP | 4-246852 A | | 9/1992 |
| JP | 2001-217381 | * | 8/2001 |

* cited by examiner

*Primary Examiner*—Nathan J. Flynn
*Assistant Examiner*—Ahmed N. Sefer
(74) *Attorney, Agent, or Firm*—Frishauf, Holtz, Goodman & Chick, P.C.

(57) ABSTRACT

A semiconductor package includes a semiconductor substrate having a device region on one surface thereof, and a connecting pad electrically connected to the device region. A support substrate is formed on a side of one surface of the semiconductor substrate. An external electrode formed on a side of the other surface of the semiconductor substrate. A connecting wire is partially extended outside the semiconductor substrate for electrically connecting the connecting pad and external electrode.

12 Claims, 24 Drawing Sheets

SEMICONDUCTOR PACKAGE AND METHOD OF FABRICATING THE SAME

CROSS-REFERENCE TO RELATED APPLICATIONS

This application is based upon and claims the benefit of priority from the prior Japanese Patent Application No. 2002-274807, filed Sep. 20, 2002, the entire contents of which are incorporated herein by reference.

BACKGROUND OF THE INVENTION

1. Field of the Invention

This invention relates to a semiconductor package and a method of fabricating the same.

2. Description of the Related Art

A conventional semiconductor package, especially a semiconductor substrate on the major surface of which a photosensitive element such as a CCD (Charge Coupled Device) or transistor is formed is fabricated as follows. That is, a lead frame and window frame are fixed on a ceramic substrate via low-melting-point glass. After the CCD chip is fixed on the ceramic substrate, an electrode on the CCD chip, an inner lead, and an inner lead end portion having a recess are electrically connected by thin metal wires, and a cap is fixed via a thermosetting resin (e.g., JPH04-246852)

Also, an integrated circuit die for an EPROM, CCD, and another optical IC device is fabricated as follows. This integrated circuit die has a substrate having metalized vias extending therethrough. The die is attached to the first surface of this substrate and electrically connected to the metalized vias. The substrate around this die is coated with an adhesive bead. The bead covers the side surfaces of the die, the peripheral portion of the first surface in the upper portion of the die, and bonding wires. A transparent encapsulating material layer is deposited on the die in a cavity formed by the bead, and this encapsulating film is hardened, thereby forming the outer surface of the package (e.g., U.S. Pat. No. 5,962,810).

The semiconductor package described in JPH04-246852 has a large thickness because external leads are included. The semiconductor package described in U.S. Pat. No. 5,962,810 has a substrate having metalized vias extending therethrough. That is, vias are formed in a thick rigid substrate, e.g., a glass substrate for holding an optical IC device, and conducting portions are formed on the inner surface of the substrate. This process is time-consuming, and the reliability of the process is difficult to ensure. In addition, the productivity is low because dies are mounted one by one on the substrate.

BRIEF SUMMARY OF THE INVENTION

It is an object of the present invention to provide a semiconductor package which has no via hole conducting portion and can be made thin, and a method of fabricating the same.

It is another object of the present invention to provide a semiconductor package fabrication method capable of fabricating a plurality of semiconductor packages at once.

According to an aspect of the present invention, there is provided a semiconductor package comprising a semiconductor substrate including a device region on its one surface and a connecting pad around the device region, an outer substrate formed on a side of one surface of the semiconductor substrate, a distribution wire formed on a side of the other surface of the semiconductor substrate, and connecting means, partially formed around the semiconductor substrate, for electrically connecting the connecting pad and distribution wire.

According to another aspect of the present invention, there is provided a semiconductor device fabrication method comprising steps of forming a plurality of connecting wires on one surface of a wafer-like semiconductor substrate including, on one surface, a plurality of device regions and a connecting pad formed around each device region, such that one end portion of each of the plurality of connecting wires is connected to a corresponding one of the connecting pads, and the other end portion of the connecting wire is extended outside the corresponding connecting pad, placing an outer substrate on a side of one surface of the semiconductor substrate, which includes the plurality of connecting wires, exposing the other end portions of the plurality of connecting wires by removing, between the device regions, at least portions of the semiconductor substrate, which correspond to the other end portions of the plurality of connecting wires, forming a plurality of distribution wires on the other surface of the semiconductor substrate so as to be connected to the other end portions of the plurality of connecting wires, and obtaining a plurality of semiconductor packages each including the semiconductor substrate with the distribution wire, by cutting the outer substrate between the device regions.

DETAILED DESCRIPTION OF THE INVENTION (First Embodiment)

Figure 1:
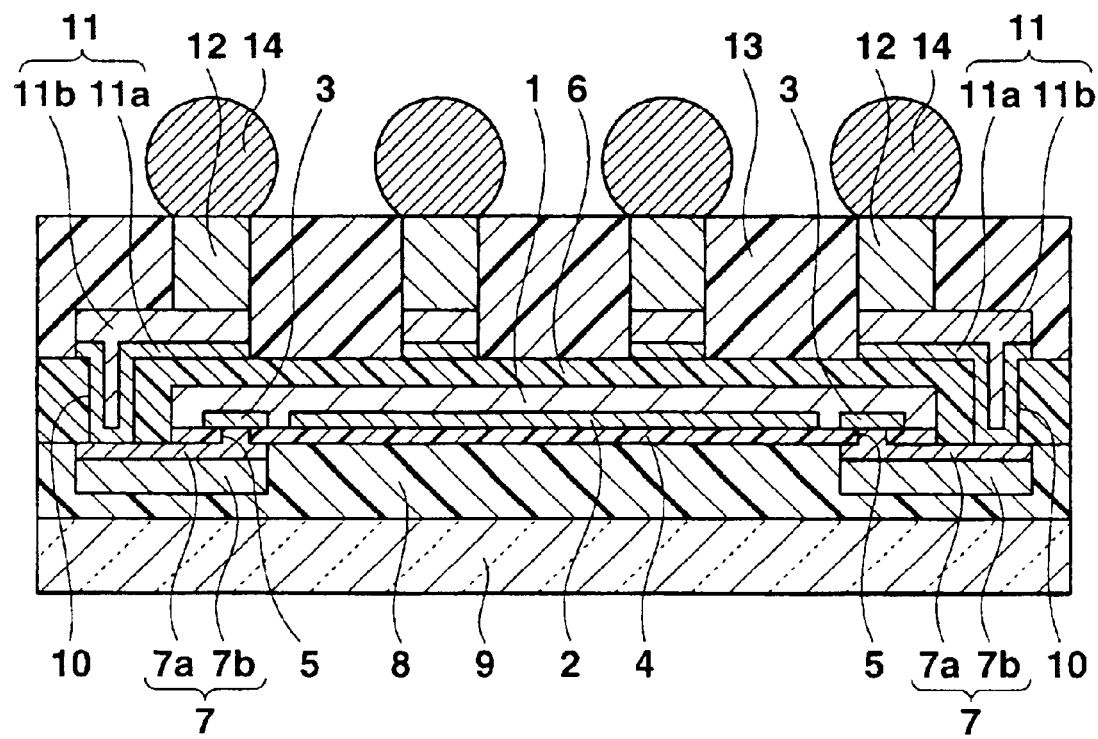
FIG. 1 is a sectional view of a semiconductor package according to the first embodiment of the present invention.

FIG. 1 is a sectional view of a semiconductor package according to the first embodiment of the present invention. This semiconductor package includes a silicon substrate (semiconductor substrate) 1. In a central portion of the lower surface of the silicon substrate 1, a photoelectric conversion device region 2 including an element such as a CCD, photodiode, or phototransistor is formed.

In a peripheral portion of the lower surface of the silicon substrate 1, a plurality of connecting pads 3 made of an aluminum-based metal or the like are formed to be electrically connected to the photo-electric conversion device region 2. An insulating film 4 made of silicon oxide or the like is formed on that lower surface of the silicon substrate 1, which includes the lower surface of the device region 2, except for central portions of the connecting pads 3. These central portions of the connecting pads 3 are exposed through holes 5 formed in the insulating film 4.

An insulating film 6 made of polyimide or the like is formed on the upper surface and side surfaces of the silicon substrate 1. In this structure, the lowest surface of the insulating film 6 formed on the side surfaces of the silicon substrate 1 is substantially leveled with the lower surface of the insulating film 4 formed on the lower surface of the silicon substrate 1.

From the lower surface of each connecting pad 3 exposed through the hole 5 in the insulating film 4 to a predetermined portion of the lower surface of the insulating film 6 formed around the connecting pad 3, a connecting wire 7 made of a first metal layer or base layer 7a and a second metal layer or a main layer 7b formed below the first metal layer 7a is formed. As a consequence, one end portion of each connecting wire 7 is connected to the connecting pad 3 of the silicon substrate 1. The other end portion of the wire 7 extends outside the silicon substrate 1.

On those lower surfaces of the silicon substrate 1 (more specifically, the insulating film 4) and the insulating film 6, which include the connecting wires 7, a glass substrate 9 as a support substrate is formed via a transparent adhesive layer 8 made of a transparent epoxy-based resin. Accordingly, the dimension in the lateral direction of the glass substrate 9 is slightly larger than that of the silicon substrate 1.

In that portion of the insulating film 6, which corresponds to the other end portion of each connecting wire 7, a hole 10 is formed to extend through the insulating film 6. From the upper surface of the other end portion of each connecting wire 7 exposed through the hole 10 to a predetermined portion of the upper surface of the insulating film 6, a distribution wire 11 made of a lower metal layer 11a and an upper metal layer 11b formed on the lower metal layer 11a is formed.

A columnar electrode (external electrode) 12 is formed on the upper surface of that connecting pad portion of each distribution wire 11, which extends onto the insulating film 6. On the upper surface of the insulating film 6 including the distribution wires 11, an encapsulating film (insulating film) 13 made of an epoxy-based resin or the like is formed such that its upper surface is substantially leveled with the upper surface of each columnar electrode 12. A solder ball 14 is formed on the upper surface of each columnar electrode 12.

Figure 2:
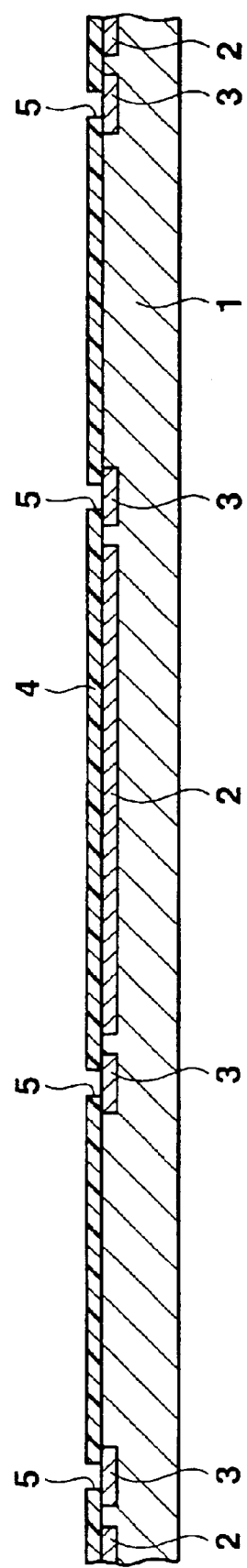
FIG. 2 is a sectional view showing an initially prepared structure in an example of a method of fabricating the semiconductor package shown in FIG. 1.

An example of a method of fabricating this semiconductor package will be described below. First, as shown in FIG. 2, a structure is prepared in which photoelectric conversion device regions 2, aluminum connecting pads 3, and a silicon oxide insulating film 4 are formed on a wafer-like silicon substrate (semiconductor substrate) 1, and a central portion of each connecting pad 3 is exposed through a hole 5 formed in the insulating film 4. The thickness of the silicon substrate 1 in this state is larger to a certain extent than that shown in FIG. 1. For example, the thickness is 0.5 to 1.0 mm.

Figure 3:
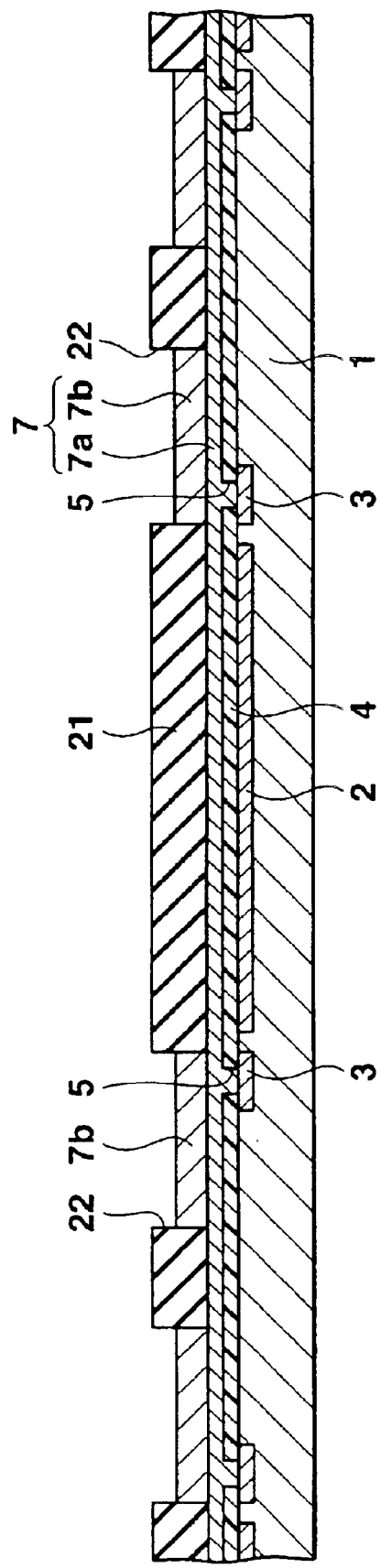
FIG. 3 is a sectional view for explaining a fabrication step following FIG. 2.

Next, as shown in FIG. 3, a first metal layer 7a is formed on the entire upper surface of the insulating film 4, which includes the upper surfaces of the connecting pads 3 exposed through the holes 5. In this example, the first metal layer 7a is made only of a copper layer formed by electroless plating. However, the metal layer 7a may also be made only of a copper layer formed by sputtering, or obtained by forming a copper layer by sputtering on a thin layer of titanium or the like formed by sputtering. This similarly applies to a lower metal layer 11a (to be described later).

A plating resist layer 21 is formed on the upper surface of the first metal layer 7a and patterned. Holes 22 are formed in those portions of the plating resist film 21, which correspond to regions where connecting wires 7 are to be formed. The first metal layer 7a is then used as a plating electric current path to perform electroplating of copper, thereby forming a second metal layer 7b on the upper surface of the first metal layer 7a in each hole 22 of the plating resist film 21.

Figure 4:
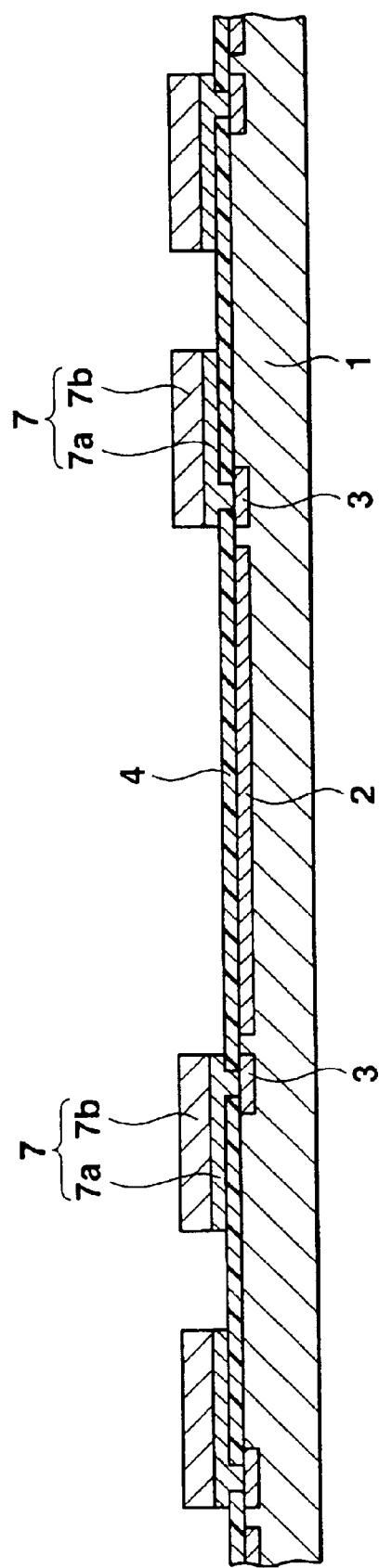
FIG. 4 is a sectional view for explaining a fabrication step following FIG. 3.

Subsequently, the plating resist film 21 is removed, and the second metal layer 7b is used as a mask to etch away unnecessary portions of the first metal layer 7a. Consequently, as shown in FIG. 4, the first metal layer 7a remains only below the second metal layer 7b, forming connecting wires 7 each made of the remaining first metal layer 7a and the second metal layer 7b formed on the entire upper surface of the first metal layer 7a.

Figure 5:
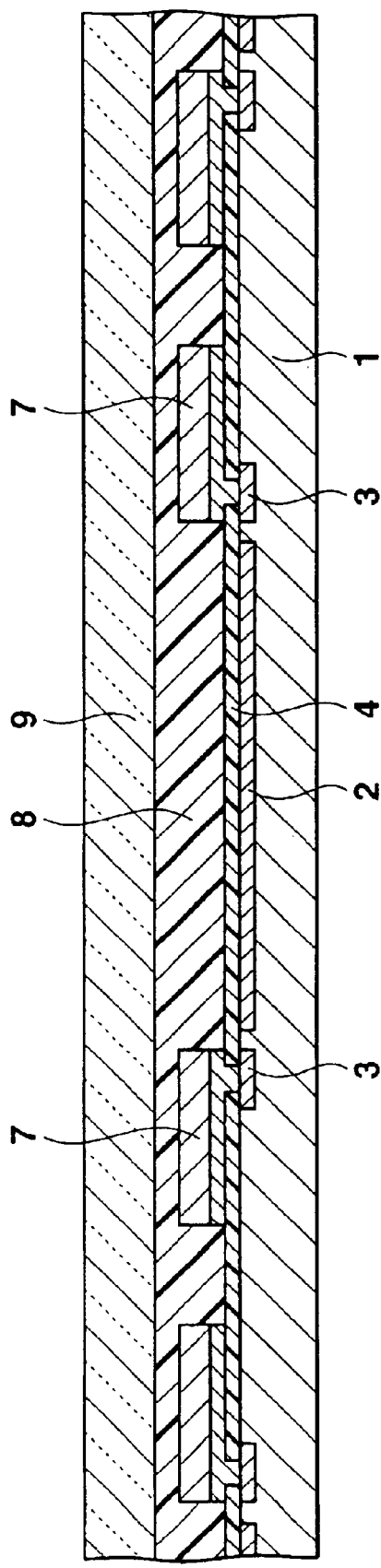
FIG. 5 is a sectional view for explaining a fabrication step following FIG. 4.
Figure 6:
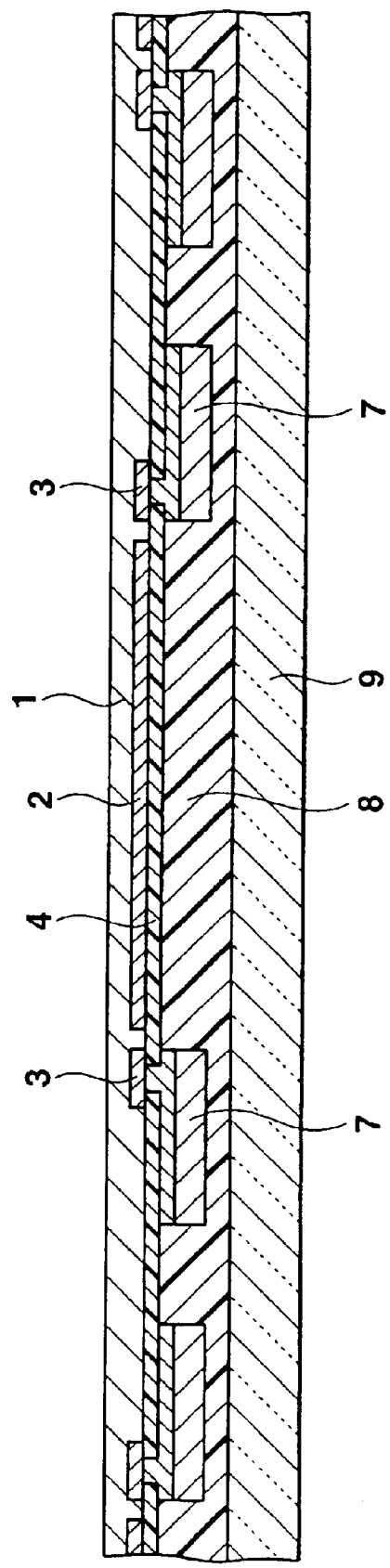
FIG. 6 is a sectional view for explaining a fabrication step following FIG. 5.

As shown in FIG. 5, a glass substrate 9 is adhered to the entire upper surface of the insulating film 4, which includes the connecting wires 7, via a transparent adhesive layer 8 made of an epoxy-based resin or the like. This structure shown in FIG. 5 is then turned upside down. As shown in FIG. 6, the silicon substrate 1 is thinned by properly polishing the upper surface of the silicon substrate 1 away from the surface on which the photoelectric conversion device regions 2 are formed. For example, the thickness of the silicon substrate 1 is decreased to 50 to 400 μm.

Figure 7:
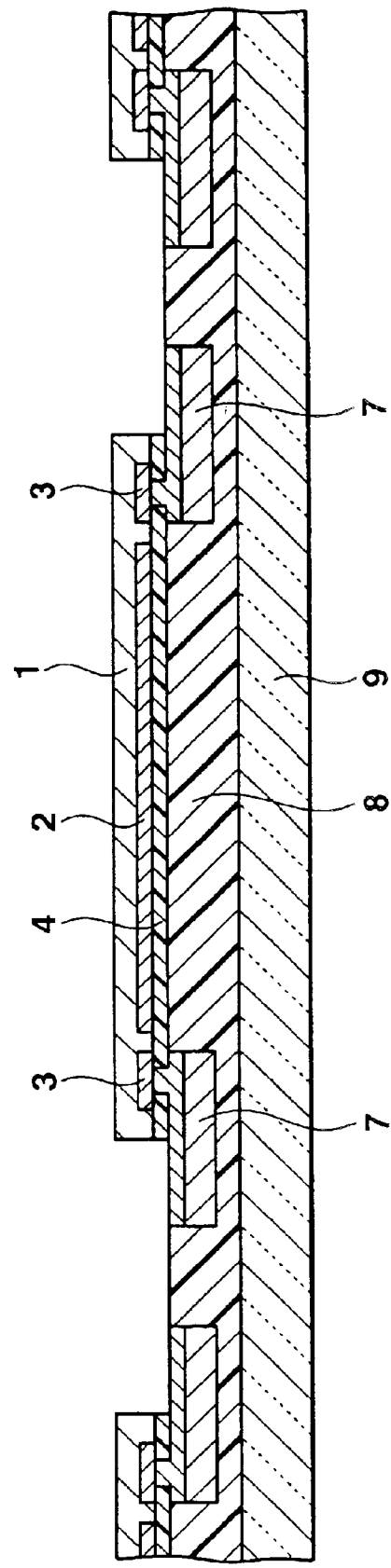
FIG. 7 is a sectional view for explaining a fabrication step following FIG. 6.

Subsequently, the wafer-sized silicon substrate 1 and the insulating film 4 on the lower surface of the silicon substrate 1 are so processed as to separate the photoelectric conversion device regions 2. That is, as shown in FIG. 7, portions of the substrate 1 and the insulating film 4 between the connecting wires 7 (connecting pads 3) are removed by dicing or etching. This partial removal of the silicon substrate 1 and the insulating film 4 on the lower surface of the silicon substrate 1 is so performed that not only the portion of the transparent adhesive layer 8 formed around the silicon substrate 1 but also a portion of the upper surface of each connecting wire 7 are exposed. In this manner, the transparent adhesive layer 8 and the exposed surface of the first metal layer 7a of each connecting wire 7 are substantially leveled with the lower surface of the insulating film 4.

Figure 8:
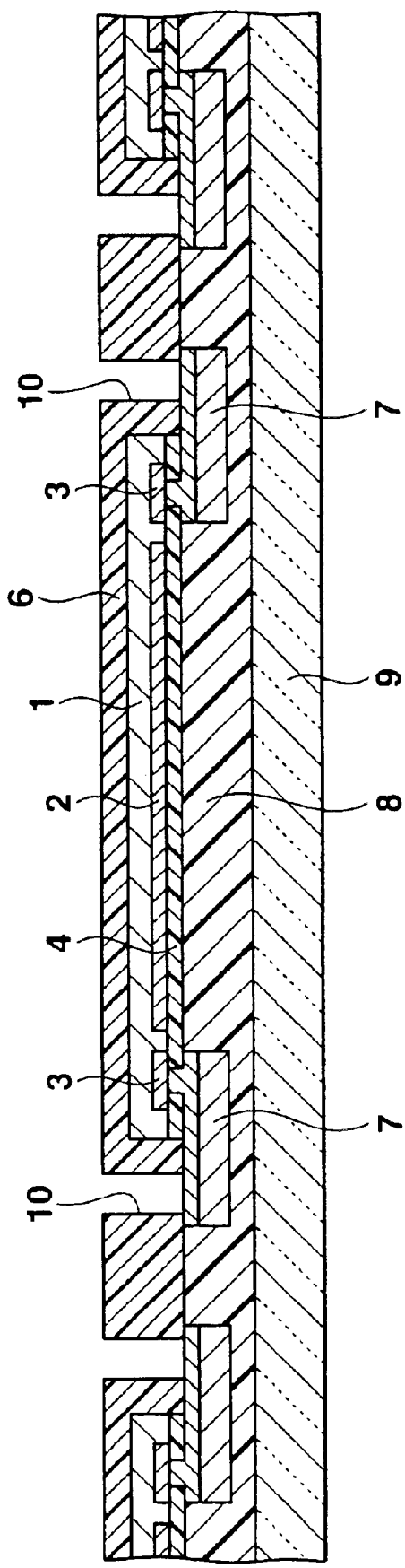
FIG. 8 is a sectional view for explaining a fabrication step following FIG. 7.

As shown in FIG. 8, an insulating film 6 made of photosensitive polyimide or the like is formed by patterning on the entire upper surface of the silicon substrate 1, which includes the connecting wires 7 formed around the silicon substrate 1 and the transparent adhesive layer 8. In this structure, holes 10 are formed in those portions of the insulating film 6, which correspond to the other end portions of the connecting wires 7.

Figure 9:
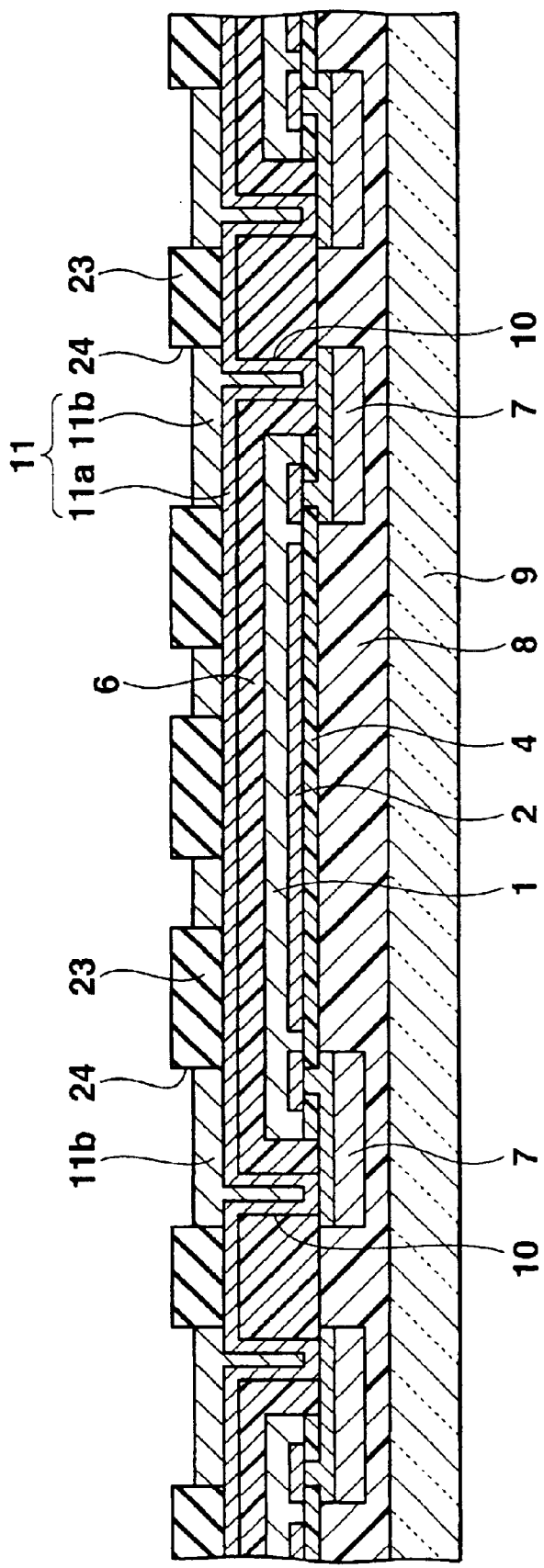
FIG. 9 is a sectional view for explaining a fabrication step following FIG. 8.

As shown in FIG. 9, a lower metal layer 11a is formed by electroless plating on the entire upper surface of the insulating film 6, which includes the other end portions of the connecting wires 7 exposed through the holes 10. A plating resist film 23 is then formed on the upper surface of the lower metal layer 11a by patterning. In this structure, holes 24 are formed in those portions of the plating resist film 23, which correspond to regions where distribution wires 11 are to be formed. Subsequently, electroplating of copper is performed by using the lower metal layer 11a as a plating electric current path, thereby forming an upper metal layer 11b on the upper surface of the lower metal layer 11a in each hole 24 of the plating resist film 23. After that, the plating resist film 23 is peeled.

Figure 10:
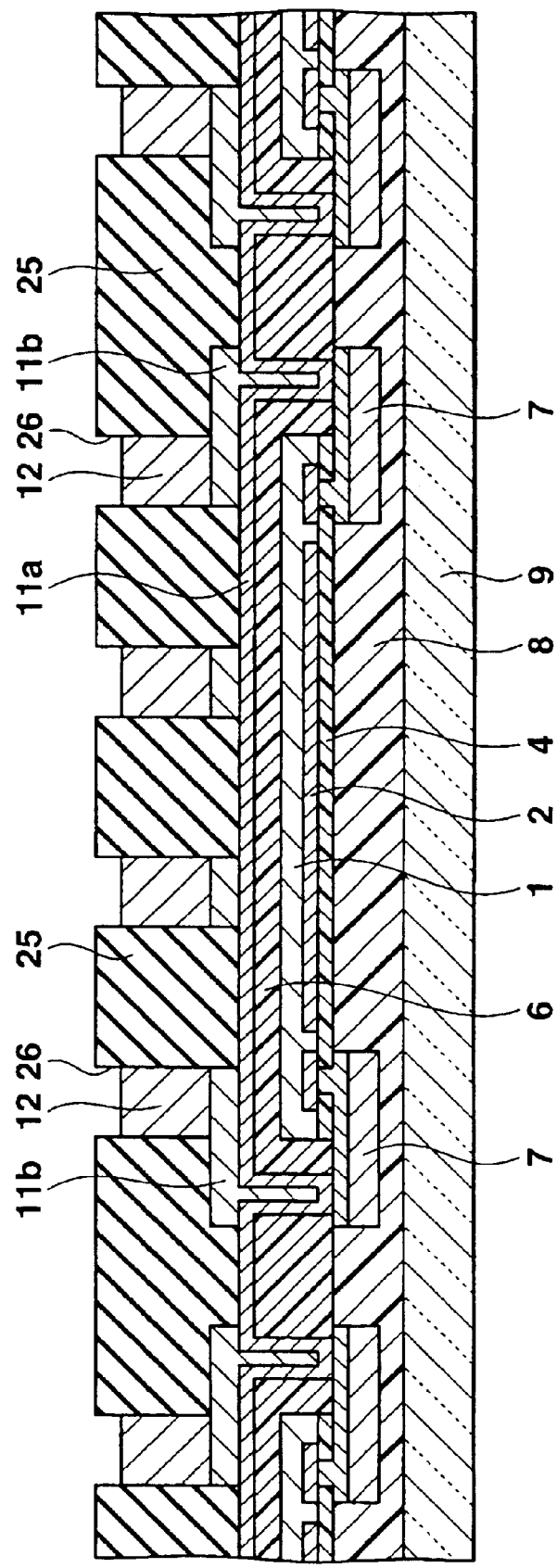
FIG. 10 is a sectional view for explaining a fabrication step following FIG. 9.

As shown in FIG. 10, a plating resist film 25 is formed on the upper surfaces of the upper metal layer 11b and lower metal layer 11a. In this structure, holes 26 are formed in those portions of the plating resist film 25, which correspond to regions where columnar electrodes 12 are to be formed. Electroplating of copper is then performed by using the lower metal layer 11a as a plating electric current path, thereby forming a columnar electrode 12 having a height of, e.g., 100 to 200 μm on the upper surface of a connecting pad portion of the upper metal layer 11b in each hole 26 of the plating resist film 25.

Figure 11:
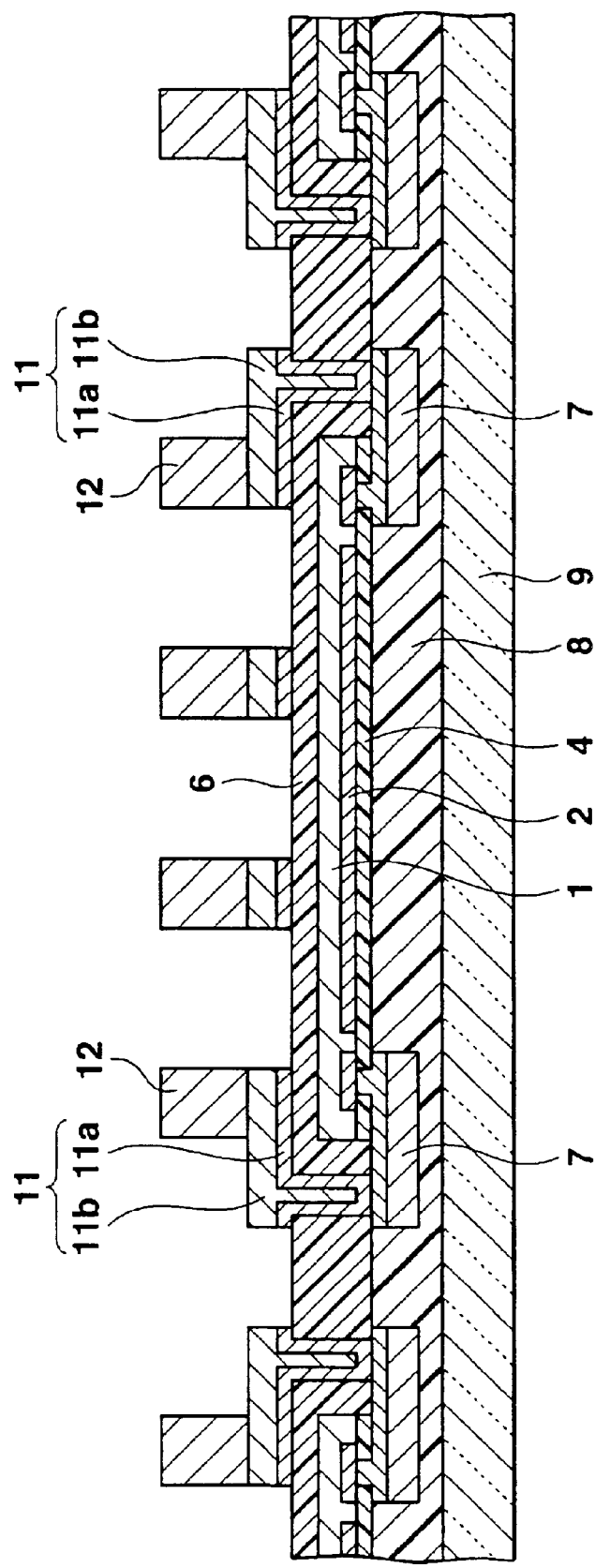
FIG. 11 is a sectional view for explaining a fabrication step following FIG. 10.

The plating resist film 25 is peeled, and unnecessary portions of the lower metal layer 11a are etched away by using the columnar electrodes 12 and upper metal layer 11b as masks. Consequently, as shown in FIG. 11, the lower metal layer 11a remains only below the upper metal layer 11b, forming distribution wires 11 each made of the remaining lower metal layer 11a and the upper metal layer 11b formed on the entire upper surface of the lower metal layer 11a.

Figure 12:
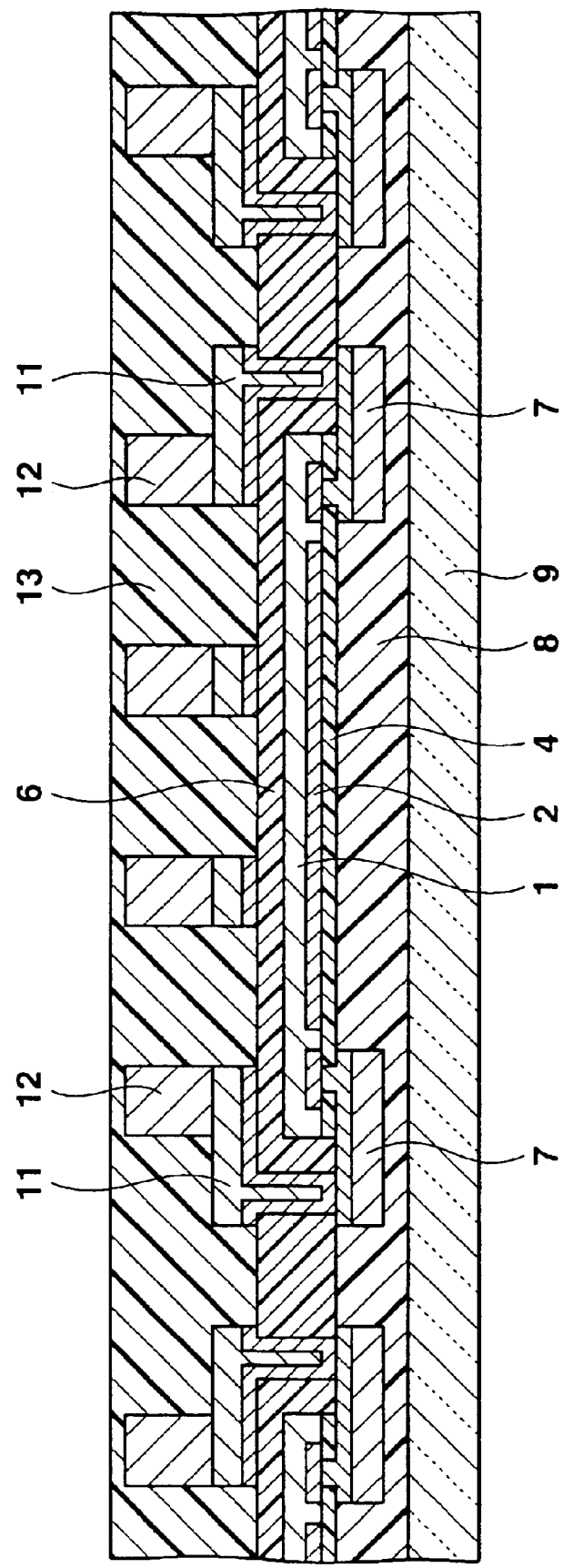
FIG. 12 is a sectional view for explaining a fabrication step following FIG. 11.
Figure 13:
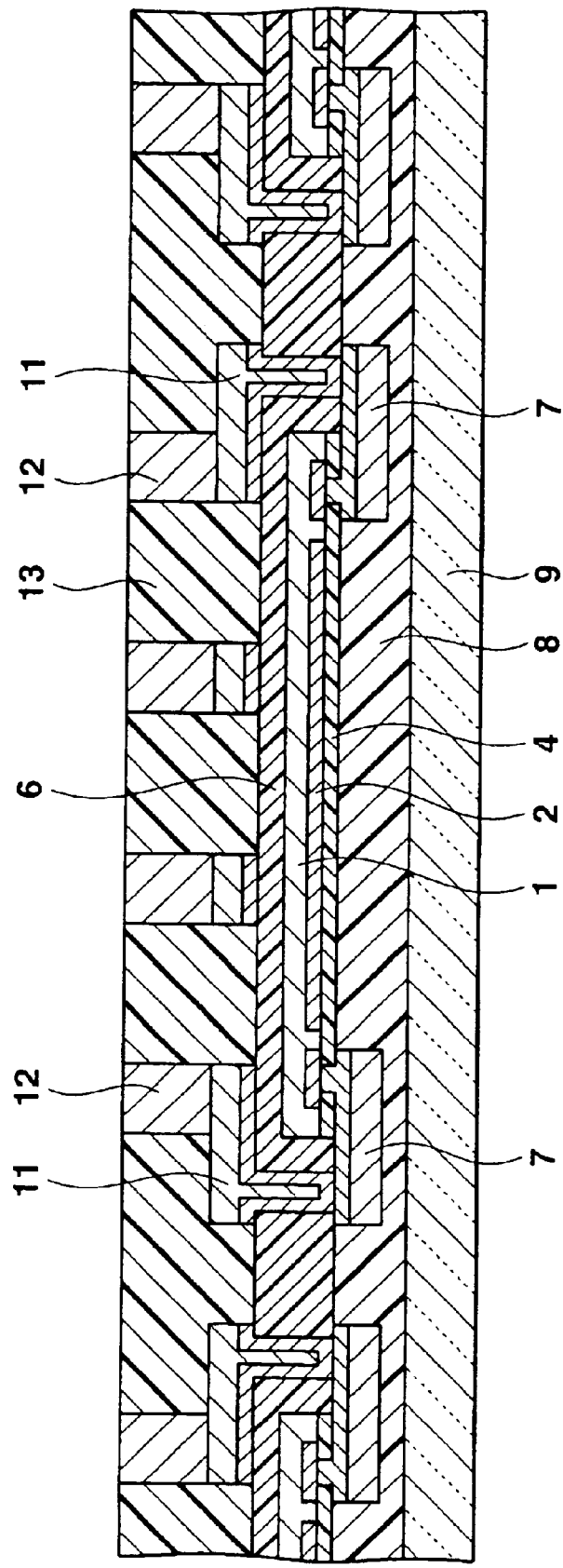
FIG. 13 is a sectional view for explaining a fabrication step following FIG. 12.

As shown in FIG. 12, on the entire upper surface of the insulating film 6, which includes the columnar electrodes 12 and distribution wires 11, an encapsulating film 13 made of an epoxy-based resin is formed such that its thickness is larger than the height of the columnar electrodes 12. In this state, therefore, the upper surface of each columnar electrode 12 is covered with the encapsulating film 13. The upper surfaces of the encapsulating film 13 and columnar electrodes 12 are then properly polished. Consequently, as shown in FIG. 13, the upper surface of each columnar electrode 12 is exposed, and the upper surface of the encapsulating film 13, which includes these exposed upper surfaces of the columnar electrodes 12 is planarized.

Figure 14:
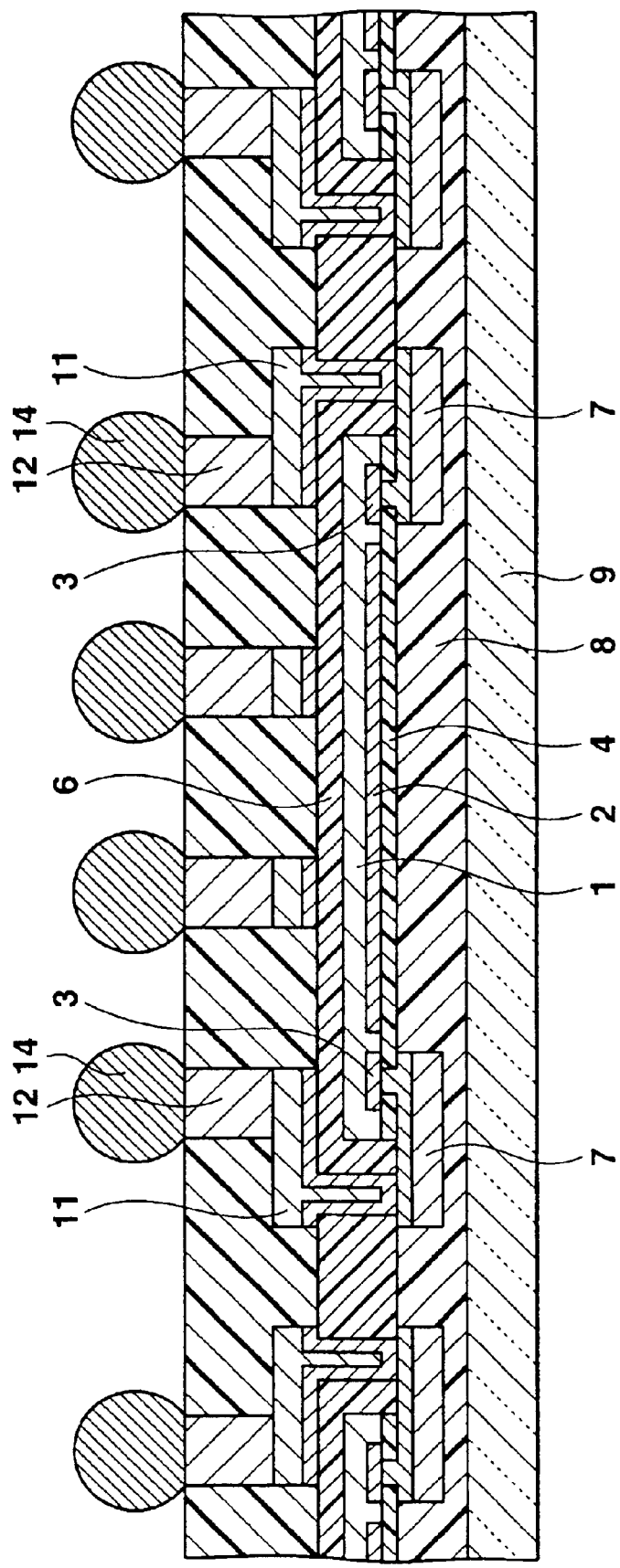
FIG. 14 is a sectional view for explaining a fabrication step following FIG. 13.

As shown in FIG. 14, a solder ball 14 is formed on the upper surface of each columnar electrode 12. To assure the bonding strength between the columnar electrode 12 and solder ball 14, before the formation of the solder balls 14 it is also possible to etch away burrs formed on the surfaces of the columnar electrodes 12, perform plating for preventing oxidation, or perform a pretreatment such as flux coating. By this pretreatment, the upper surface of each columnar electrode 12 and the upper surface of the encapsulating film 13 can be kept substantially leveled with each other, even if slight unevenness is produced between them.

Figure 15:
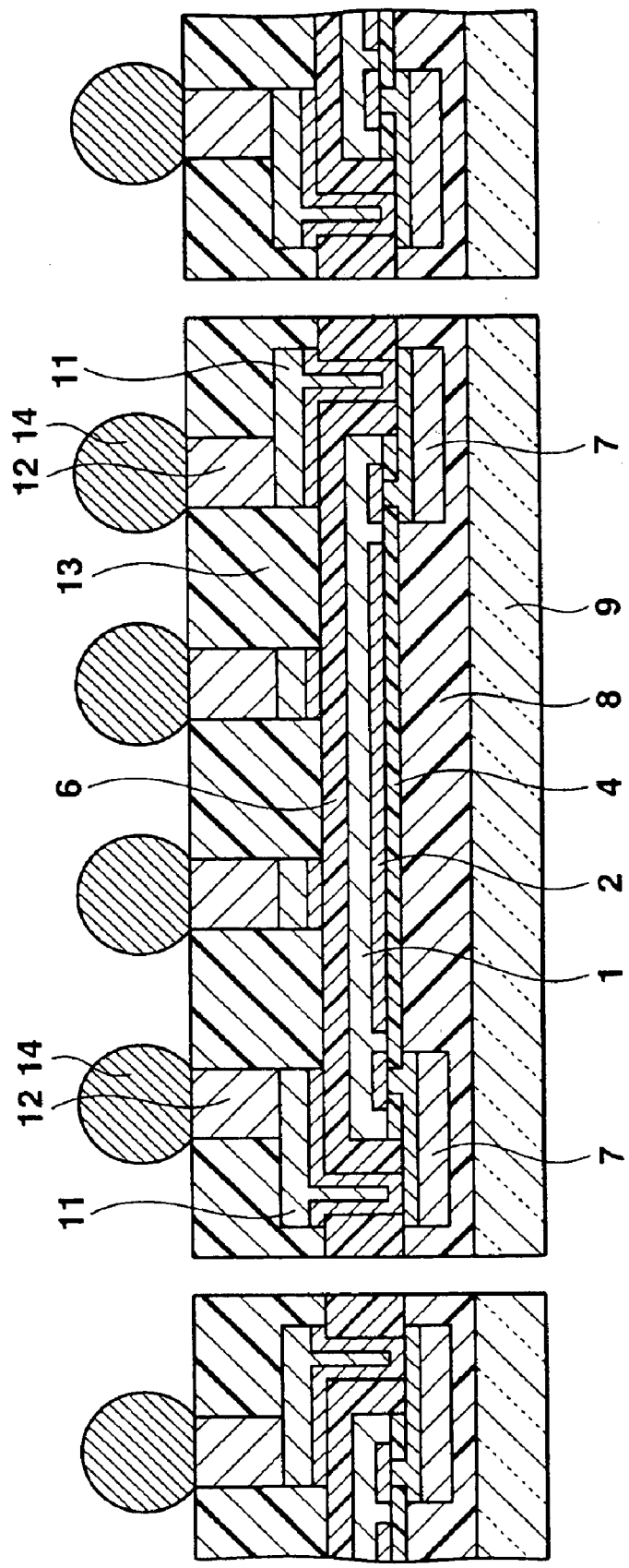
FIG. 15 is a sectional view for explaining a fabrication step following FIG. 14.

Finally, as shown in FIG. 15, the encapsulating film 13, insulating film 6, transparent adhesive layer 8, and glass substrate 9 are cut between the adjacent silicon substrates 1. As a consequence, a plurality of semiconductor packages shown in FIG. 1 are obtained.

In the thus obtained semiconductor package, the glass substrate 9 as an outer substrate is formed via the transparent adhesive layer 8 on that surface of the silicon substrate 1, on which the photoelectric conversion device 2 is formed. On the surface of the silicon substrate 1 away from the surface on which the photoelectric conversion device 2 is formed, the insulating film 6, distribution wires 11, columnar electrodes 12, encapsulating film 13, and solder balls 14 are formed. Accordingly, the semiconductor package can be made thinner than when external leads are formed.

Also, the other end portion of each connecting wire 7 for electrically connecting the connecting pad 3 of the silicon substrate 1 and the distribution wire 11 is formed around the silicon substrate 1. Therefore, no through hole conducting portion need be formed.

In addition, this semiconductor package has the columnar electrodes 12. Therefore, after the semiconductor package is mounted on a circuit board (not shown) via the solder balls 14, the stress caused by the thermal expansion coefficient difference between the silicon substrate 1 and circuit board can be reduced to some extent by the columnar electrodes 12.

Furthermore, in the above fabrication method, the formation of the connecting wires 7, the adhesion of the glass substrate 9 via the transparent adhesive layer 8, and the formation of the insulating film 6, distribution wires 11, columnar electrodes 12, encapsulating film 13, and solder balls 14 are sequentially performed on the silicon substrate 1 in the form of a wafer. Since the resultant structure is cut into a plurality of semiconductor packages after that, the productivity increases.

In the first embodiment described above, the connecting wires 7 to be connected to the connecting pads 3 formed in the silicon substrate 1 having the photoelectric conversion device region 2 are formed by using the silicon substrate 1 as a base member. However, it is also possible to form the connecting wires 7 on the glass substrate 9 in advance, and connect the connecting pads 3 formed in the silicon substrate 1 having the photoelectric conversion device region 2 to the connecting wires 7. An embodiment of this method will be described below.

(Second Embodiment)

Figure 16:
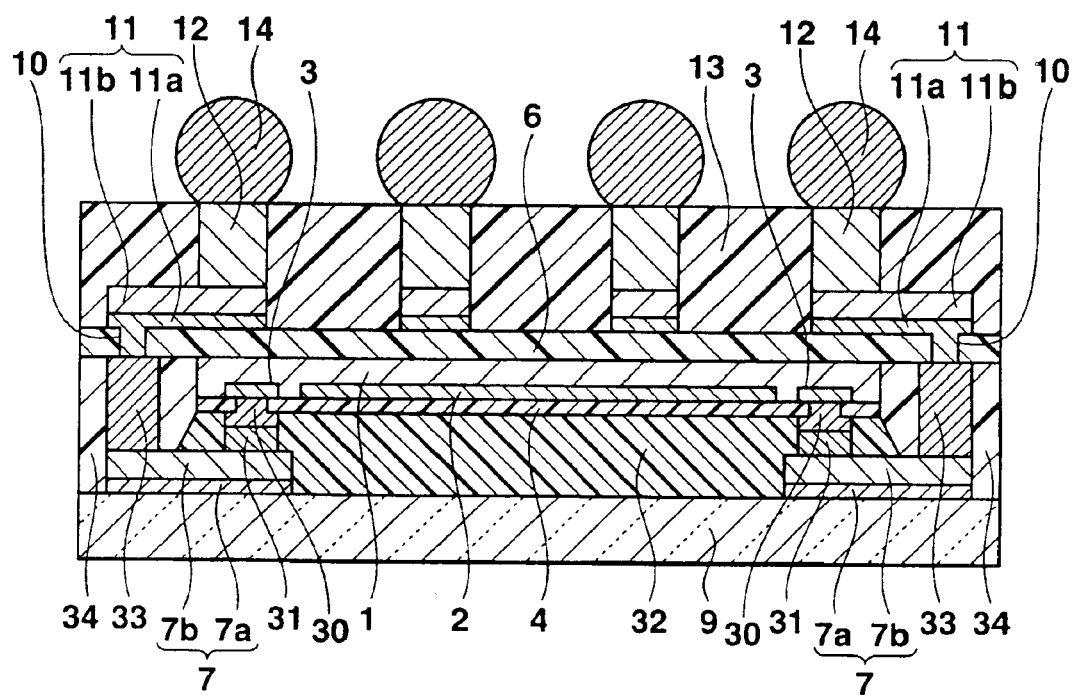
FIG. 16 is a sectional view of a semiconductor package according to the second embodiment of the present invention.

FIG. 16 is a sectional view of a semiconductor package according to the second embodiment of the present invention. The main characteristic features of this semiconductor package are that a bump electrode (connecting electrode) 31 formed on a lower surface of a base metal layer 30 on a lower surface of a connecting pad 3 of a silicon substrate 1 is connected onto one end portion of a connecting wire 7. The connection wire 7 is made up of a first metal layer or base layer 7a and second metal layer or main layer 7b formed on a glass substrate 9. A transparent encapsulating film 32 made of a transparent epoxy-based resin or the like is formed between the silicon substrate 1 and glass substrate 9. A distribution wire 11, made up of a first metal layer 11a or base layer and second metal layer 11b or main layer is connected onto a columnar electrode 33 formed on the other end portion of each connecting wire 7. The connecting wires 7 and columnar electrodes 33 around the silicon substrate 1 are covered with an encapsulating film (insulating film) 34 made of an epoxy-based resin or the like.

Figure 17:
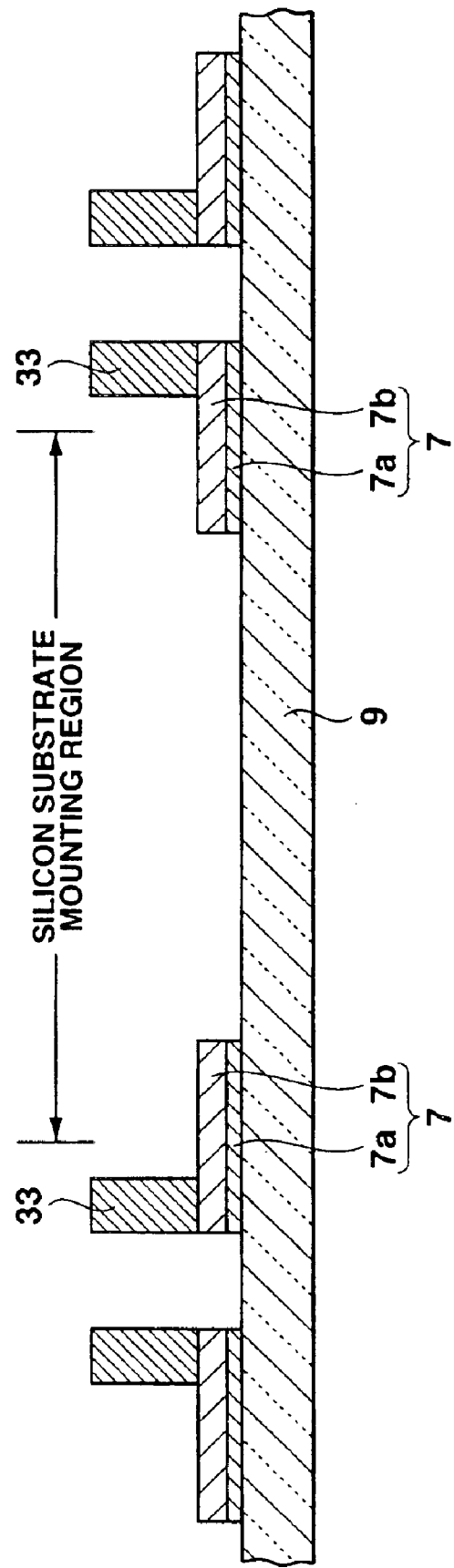
FIG. 17 is a sectional view showing an initial fabrication step in an example of a method of fabricating the semiconductor package shown in FIG. 16.

An example of a method of fabricating this semiconductor package will be described below. First, as shown in FIG. 17, on the upper surface of a glass substrate 9 having a size corresponding to a plurality of semiconductor packages, preferably, a size equivalent to the wafer size as in the first embodiment, connecting wires 7 each made up of a first metal layer 7a and second metal layer 7b are formed to extend outward from positions corresponding to connecting pads 3 connected to a photoelectric conversion device region 2 formed on the wafer. Subsequently, a columnar electrode 33 is formed on the outside end of each connecting wire 7.

The connecting wires 7 and columnar electrodes 33 can be formed by the method explained with reference to FIG. 3 (replace silicon substrate 1 with glass substrate 9) and FIG. 11. Referring to FIG. 17, between a pair of connecting wires 7 on each of which the columnar electrode 33 is formed, a silicon substrate mounting region in which a silicon substrate having the connecting pads 3 connected to the photoelectric conversion device region 2 is to be mounted is formed.

Figure 18:
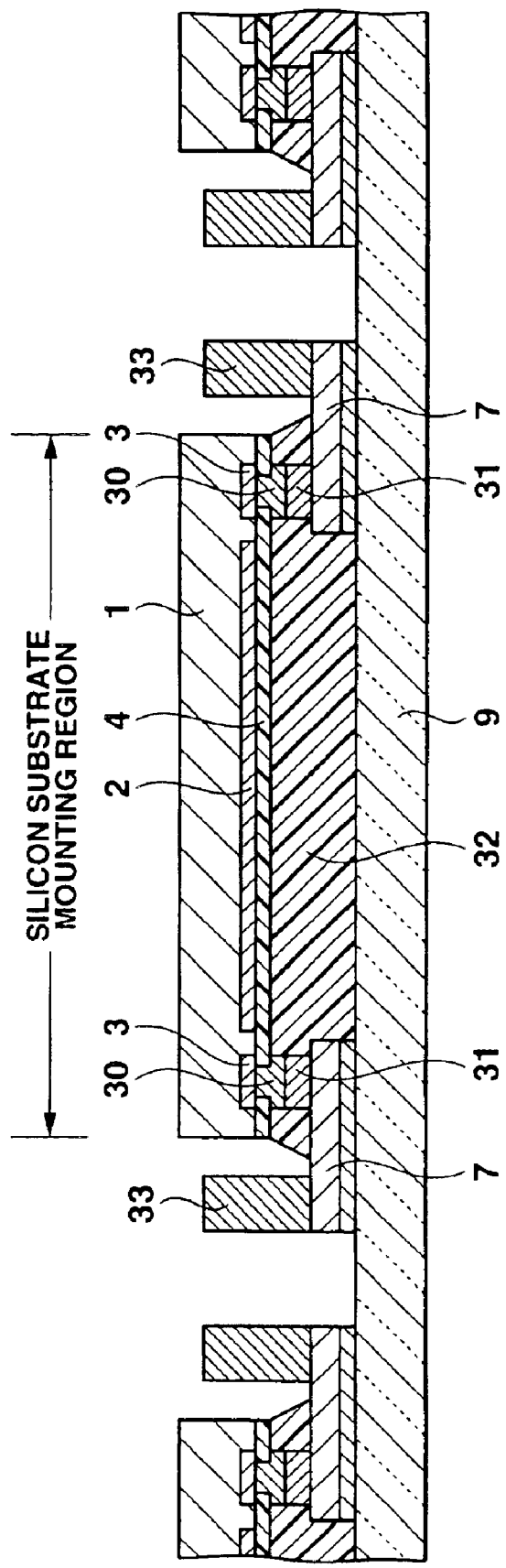
FIG. 18 is a sectional view for explaining a fabrication step following FIG. 17.

As shown in FIG. 18, a silicon substrate 1 is mounted on each of a plurality of semiconductor substrate mounting regions of the glass substrate 9, and connected to the connecting wires 7. In this state, the photoelectric conversion device region 2, the connecting pads 3, and an insulating film 4 are formed on the silicon substrate 1. In addition, a base metal layer 30 and bump electrode 31 are formed on each connecting pad 3. The base metal layer 30 and bump electrode 31 can be formed by any already known method.

The bump layer 31 formed in a peripheral portion of the lower surface of the silicon substrate 1 is connected by bonding onto the connecting wires 7 formed in the perimeter of the silicon substrate mounting region. As in the first embodiment, the thickness of the silicon substrate 1 is larger to some extent than that in the semiconductor package shown in FIG. 16. Also, in this state, only a good product is used as the silicon substrate 1 including the photoelectric conversion device region 2 and the like. Then, an encapsulating film 32 made of a transparent epoxy-based resin is formed by filling the resin between the silicon substrate 1 and glass substrate 9.

Figure 19:
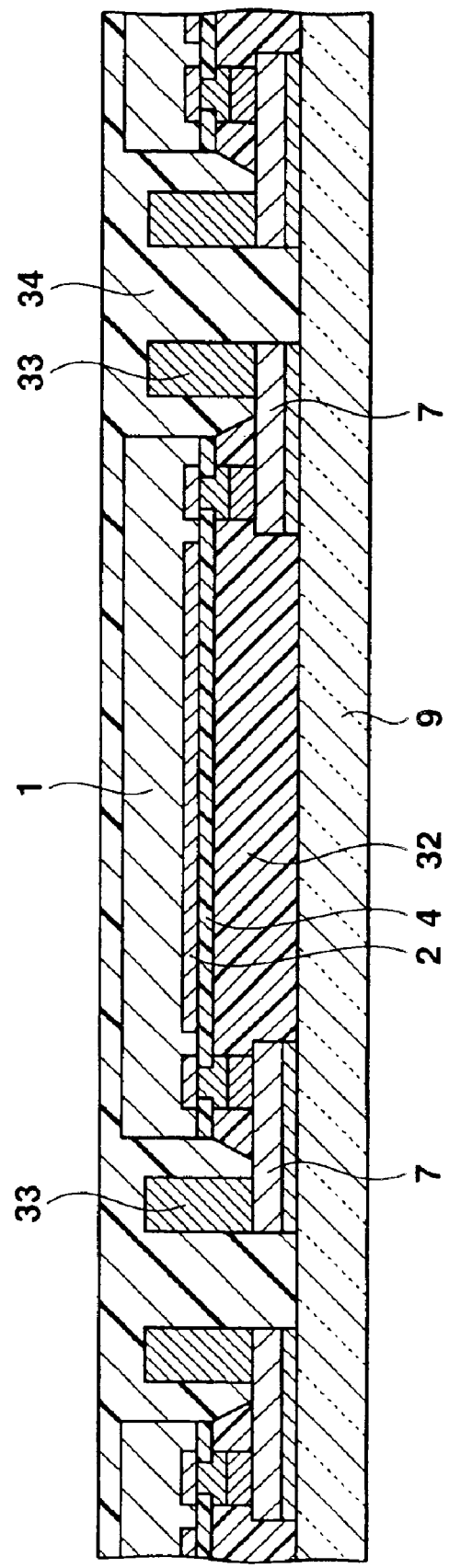
FIG. 19 is a sectional view for explaining a fabrication step following FIG. 18.
Figure 20:
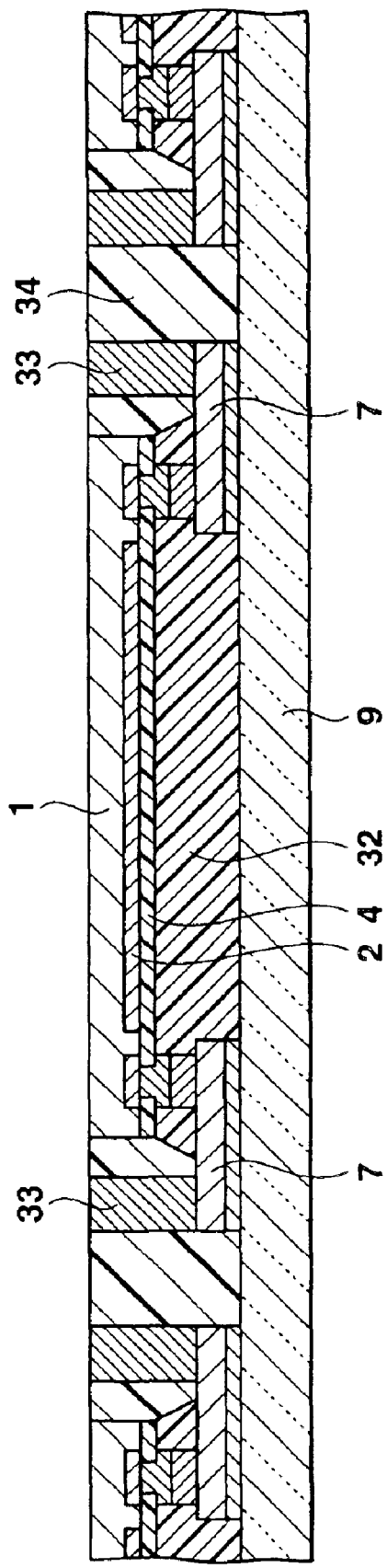
FIG. 20 is a sectional view for explaining a fabrication step following FIG. 19.

As shown in FIG. 19, the entire upper surface of the glass substrate 9, which includes the silicon substrate 1, connecting wires 7, and columnar electrodes 33 is covered with an encapsulating film 34 made of an epoxy-based resin. Then, the upper surfaces of the encapsulating film 34, silicon substrate 1, and columnar electrodes 33 are properly polished. Consequently, as shown in FIG. 20, the upper surfaces of the silicon substrate 1 and columnar electrodes 33 are exposed from the encapsulating film 34, the silicon substrate 1 is thinned, and the upper surface of the encapsulating film 34, which includes the exposed silicon substrate 1 and columnar electrodes 33 is planarized.

Figure 21:
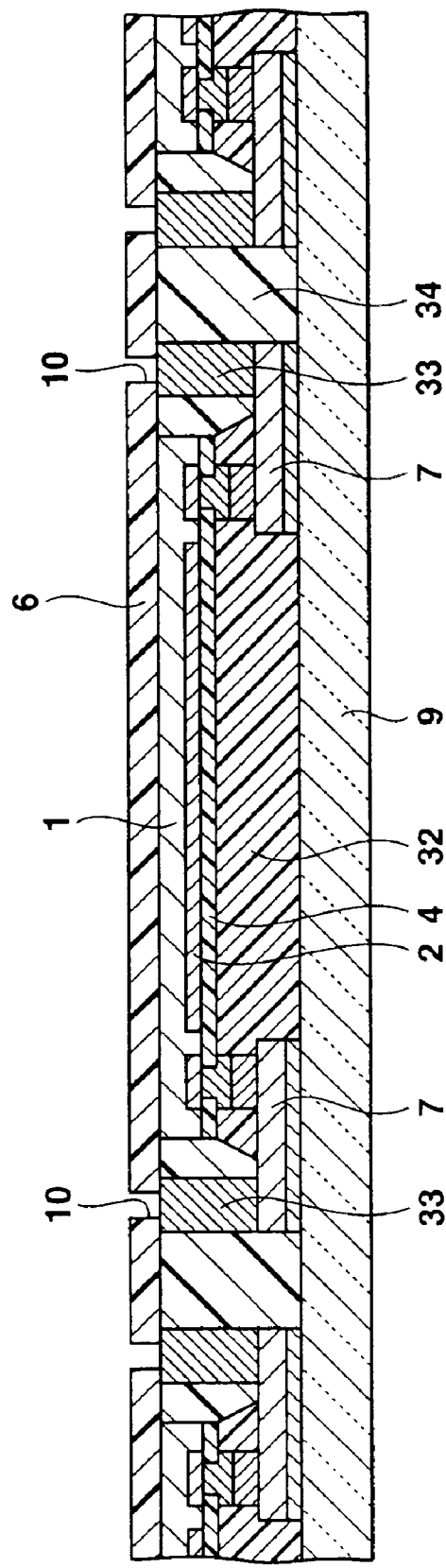
FIG. 21 is a sectional view for explaining a fabrication step following FIG. 20.

Subsequently, as shown in FIG. 21, an insulating film 6 made of photosensitive polyimide or the like is formed by patterning on the entire upper surface including the silicon substrate 1, columnar electrodes 33, and encapsulating film 34. In this structure, a hole 10 is formed in that portion of the insulating film 6, which corresponds to a central portion of the upper surface of each columnar electrode 33.

Figure 22:
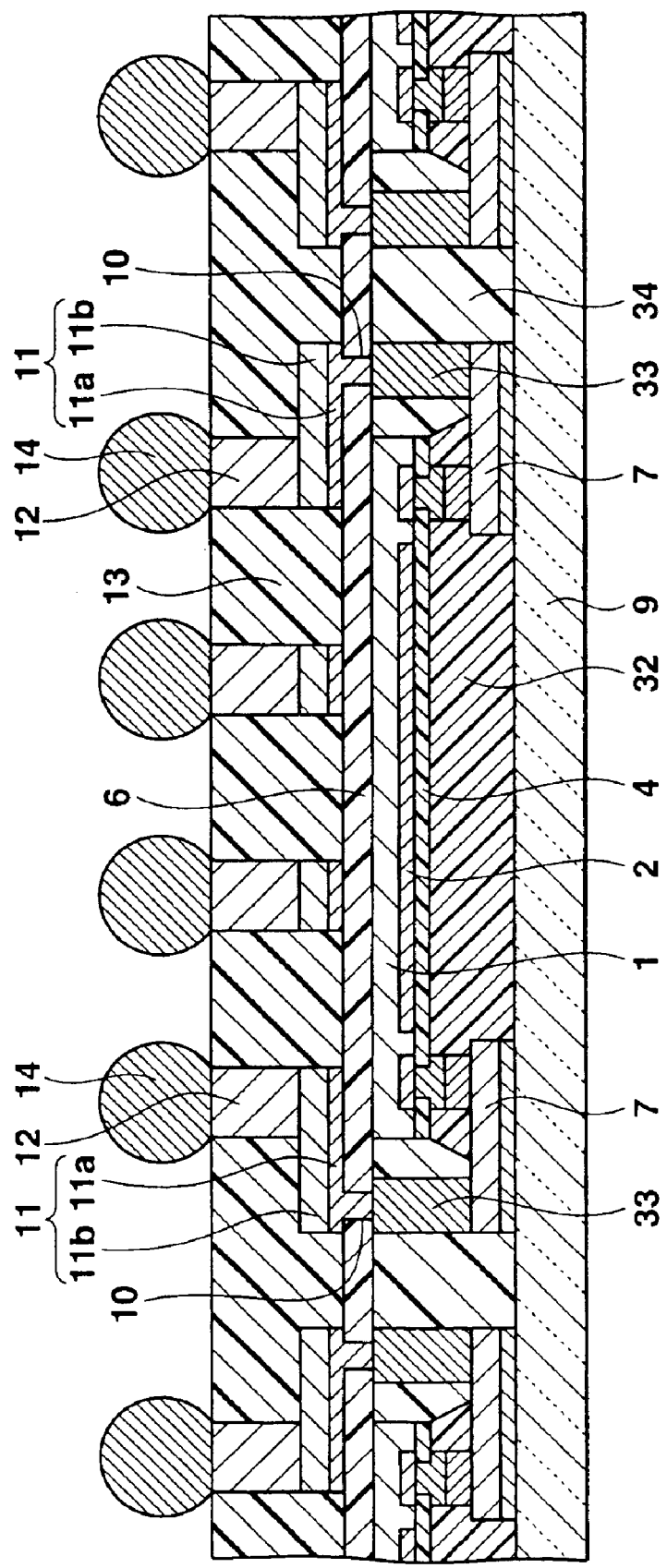
FIG. 22 is a sectional view for explaining a fabrication step following FIG. 21.
Figure 23:
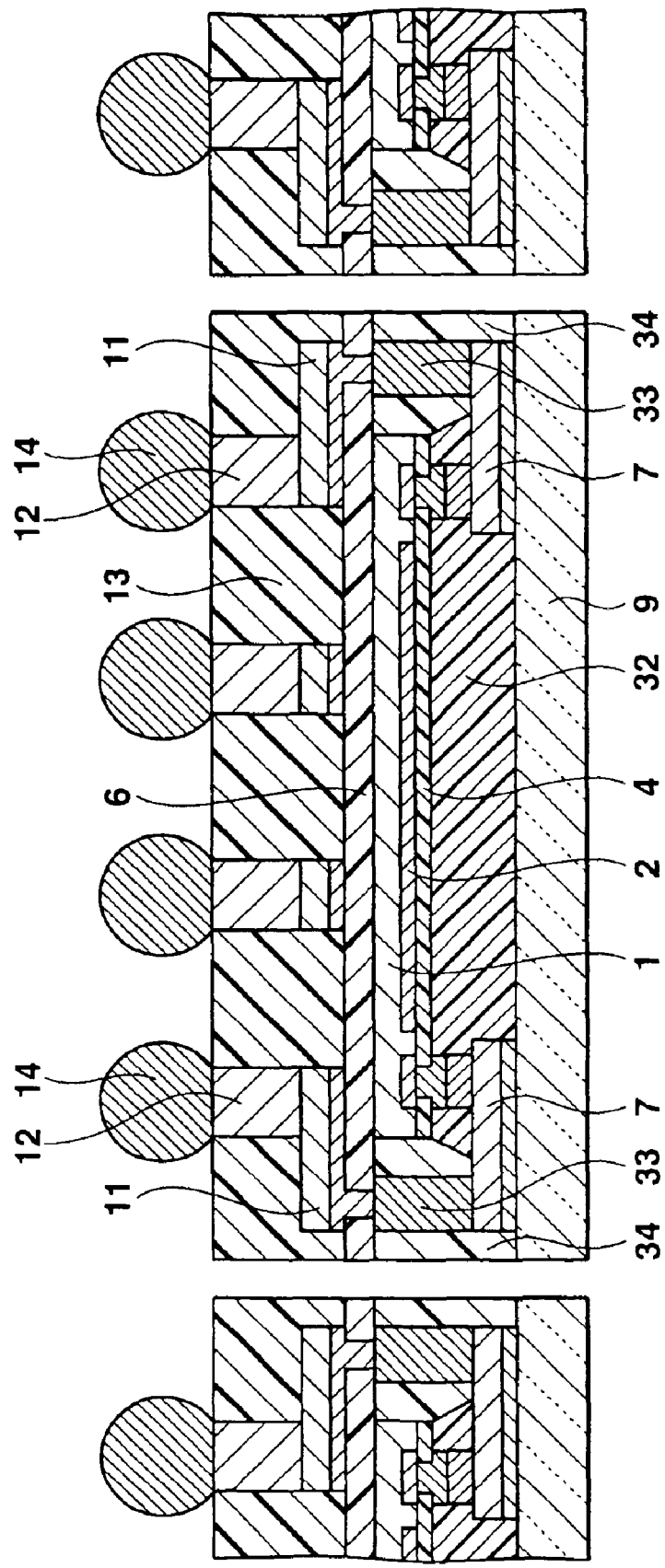
FIG. 23 is a sectional view for explaining a fabrication step following FIG. 22.

By performing the fabrication steps shown in FIGS. 9 to 14, distribution wires 11 each made up of a first metal layer or base layer 11a and second metal layer or main layer 11b, columnar electrodes 12, encapsulating film 13, and solder balls 14 are formed as shown in FIG. 22. Each distribution wire 11 is connected to the upper surface of the columnar electrode 33 through the hole 10. Finally, as shown in FIG. 23, the encapsulating film 13, insulating film 6, encapsulating film 34, and glass substrate 9 are cut between the adjacent silicon substrates 1. As a consequence, a plurality of semiconductor packages shown in FIG. 16 are obtained.

In the thus obtained semiconductor package, the glass substrate 9 as an outer substrate is formed via the transparent encapsulating film 32 on that surface of the silicon substrate 1, on which the photoelectric conversion device 2 is formed. On the surface of the silicon substrate 1 away from the surface on which the photoelectric conversion device 2 is formed, the insulating film 6, distribution wires 11, columnar electrodes 12, encapsulating film 13, and solder balls 14 are formed. Accordingly, the semiconductor package can be made thinner than when external leads are formed.

Also, a portion of each connecting wire 7 for electrically connecting the connecting pad 3 of the silicon substrate 1 and the distribution wire 11, and each columnar electrode 33 are formed around the silicon substrate 1. Therefore, no through hole conducting portion need be formed in the supporting member.

In addition, this semiconductor package has the columnar electrodes 12. Therefore, after the semiconductor package is mounted on a circuit board (not shown) via the solder balls 14, the stress caused by the thermal expansion coefficient difference between the silicon substrate 1 and circuit board can be reduced to some extent by the columnar electrodes 12.

Furthermore, in the above fabrication method, the formation of the connecting wires 7 and columnar electrodes 33, the mounting of the silicon substrate 1, and the formation of the transparent encapsulating film 32, encapsulating film 34, insulating film 6, distribution wires 11, columnar electrodes 12, encapsulating film 13, and solder balls 14 are sequentially performed on the glass substrate 9 having a size corresponding to a plurality of semiconductor packages. Since the resultant structure is cut into a plurality of semiconductor packages after that, the fabrication process can be simplified.

(Other Embodiments)

Figure 24:
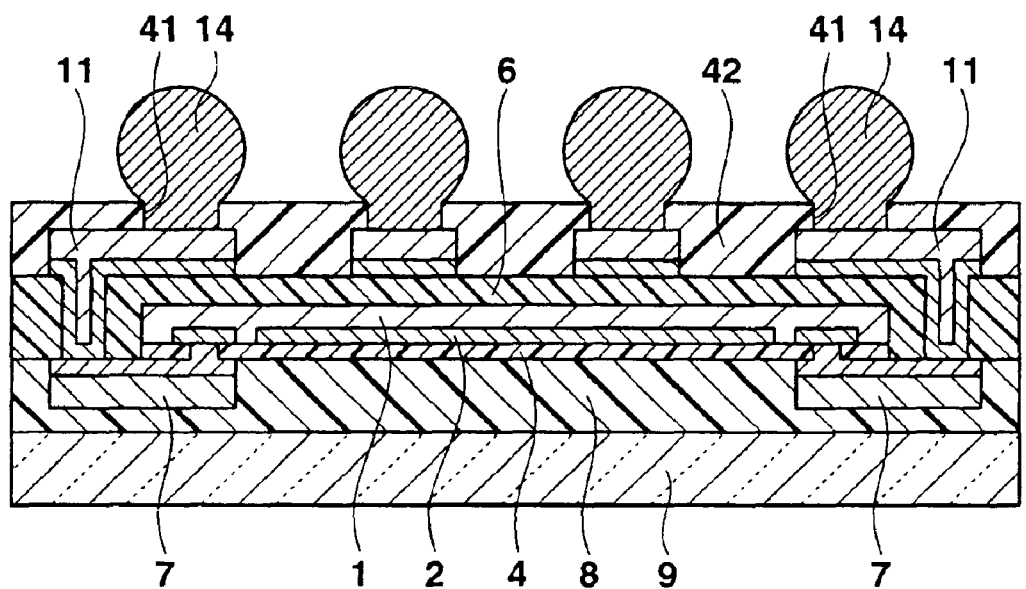
FIG. 24 is a sectional view of a semiconductor package according to still another embodiment of the present invention.

In each of the above embodiments, the solder ball 14 is formed on the columnar electrode 12 formed on the connecting pad portion of the distribution wire 11. However, the present invention is not limited to these embodiments. For example, as in another embodiment of the present invention shown in FIG. 24, an insulating film 42 having holes 41 in portions corresponding to connecting pad portions of distribution wires 11 may be formed by patterning on the entire upper surface of an insulating film 6, which includes the distribution wires 11. In this structure, a solder ball 14 is formed in and on each hole 42 so as to be connected to the connecting pad portion of the distribution wire 11.

Also, in each of the above embodiments, a photoelectric conversion device is formed on a semiconductor substrate. However, the present invention is applicable not only to a photoelectric conversion device but also to an integrated circuit for a memory or for control, or to a device in which a sensor element or the like is formed.

In the present invention as has been explained above, a semiconductor substrate has a device region on its one surface and has connecting pads around this device region. An outer substrate is formed on this surface of the semiconductor substrate, and distribution wires are formed on the other surface. This makes it possible to decrease the thickness of the obtained semiconductor package. In addition, a portion of a connecting means for connecting each connecting pad to the distribution wire is formed around the semiconductor substrate. Accordingly, no through hole conducting portion is necessary. Also, since the connecting means and distribution wires can be sequentially formed on a plurality of semiconductor substrates, the productivity can be increased.

What is claimed is:

1. A semiconductor package comprising:

a semiconductor substrate including a device region on a first surface thereof, and a connecting pad electrically connected to the device region;

a connecting wire which is formed on a side of the first surface of the semiconductor substrate and which includes a first end electrically connected to the connecting pad and a second end extending outside of the semiconductor substrate;

an insulating film formed on the second surface of the semiconductor substrate and the connecting wire and having a hole at a position corresponding to the second end of the connecting wire;

a support substrate formed on the side of the first surface of the semiconductor substrate so as to support the semiconductor substrate;

an external electrode formed on the insulating film; and a distribution wire for electrically connecting the connecting wire and external electrode via the hole in the insulating film.

2. The package according to claim 1, wherein the connecting wire comprises a metal plating layer.

3. The package according to claim 1, wherein the connecting wire includes a portion in close contact with the first surface of the semiconductor substrate.

4. The package according to claim 1, wherein the connecting wire is formed in close contact with the support substrate.

5. The package according to claim 1, further comprising a projecting connecting electrode between the connecting pad and connecting wire.

6. The package according to claim 1, wherein the external electrode comprises a columnar electrode, and a solder ball is formed on the columnar external electrode.

7. The package according to claim 6, wherein an encapsulating film is formed around the columnar electrode on the insulating film.

8. The package according to claim 1, wherein the device region comprises a photoelectric conversion device region.

9. The package according to claim 1, wherein the support substrate comprises a glass substrate.

10. The package according to claim 9, wherein one of a transparent adhesive layer and a transparent encapsulating layer is formed between the semiconductor substrate and glass substrate.

11. A semiconductor package comprising:

a semiconductor substrate including a device region on a first surface thereof, and a connecting pad electrically connected to the device region;

a support substrate formed on a side of the first surface of the semiconductor substrate;

an external electrode formed on a side of a second surface of the semiconductor substrate; and connecting means, partially extended outside the semiconductor substrate, for electrically connecting the connecting pad and external electrode;

wherein the connecting means includes a distribution wire extended to the side of the second surface of the semiconductor substrate, and a connecting wire formed on a surface of the support substrate opposing the semiconductor substrate, wherein the connecting wire comprises a first end portion connected to the connecting pad, and a second end portion extended outside the semiconductor substrate, and wherein a columnar electrode is formed on the second end portion of the connecting wire, and the distribution wire is connected to the columnar electrode.

12. The package according to claim 11, wherein an insulating film is formed between the second surface of the semiconductor substrate and the distribution wire.

* * * * *